United States Patent
Yan et al.

(10) Patent No.: US 12,453,189 B2
(45) Date of Patent: Oct. 21, 2025

(54) SOLAR CELL FABRICATION

(71) Applicant: THE AUSTRALIAN NATIONAL UNIVERSITY, Acton (AU)

(72) Inventors: Di Yan, Bruce (AU); Andres Cuevas, Griffith (AU)

(73) Assignee: THE AUSTRALIAN NATIONAL UNIVERSITY, Acton (AU)

( * ) Notice: Subject to any disclaimer, the term of this patent is extended or adjusted under 35 U.S.C. 154(b) by 1609 days.

(21) Appl. No.: 16/467,105

(22) PCT Filed: Dec. 5, 2017

(86) PCT No.: PCT/AU2017/000260
§ 371 (c)(1),
(2) Date: Jun. 6, 2019

(87) PCT Pub. No.: WO2018/102852
PCT Pub. Date: Jun. 14, 2018

(65) Prior Publication Data
US 2023/0197876 A1    Jun. 22, 2023

(30) Foreign Application Priority Data
Dec. 6, 2016   (AU) ................ 2016905022

(51) Int. Cl.
H10F 10/166   (2025.01)
C23C 14/14    (2006.01)
(Continued)

(52) U.S. Cl.
CPC .......... *H10F 10/166* (2025.01); *C23C 14/14* (2013.01); *C23C 14/5806* (2013.01); *H01L 21/02381* (2013.01); *H01L 21/02532* (2013.01)

(58) Field of Classification Search
None
See application file for complete search history.

(56) References Cited

U.S. PATENT DOCUMENTS 6,432,804 B1    8/2002  Nakata
2010/0024865 A1 2/2010  Shah
(Continued)

FOREIGN PATENT DOCUMENTS

CN   205564789 U    9/2016
JP   S57109324      7/1982
(Continued)

OTHER PUBLICATIONS

Abstract of Abo-Namous, S.A., et al., "Doping effects of group III and group V elements in unhydrogenated neon-sputtered amorphous silicon," Thin Solid Films, Mar. 1985, vol. 125, Issues 1-2, pp. 39-45.
(Continued)

*Primary Examiner* — Jack S Chen
(74) *Attorney, Agent, or Firm* — DUANE MORRIS LLP; Gregory M. Lefkowitz; Randall C. Pyles

(57) ABSTRACT

The invention relates to a process for fabricating a solar cell. The process comprises depositing a layer of amorphous silicon on a substrate using physical vapour deposition, said substrate being a layer of a dielectric disposed on a silicon wafer. The amorphous silicon is then annealed so as to generate a layer of polycrystalline silicon on the substrate.

14 Claims, 8 Drawing Sheets

(51) Int. Cl.
 *C23C 14/58* (2006.01)
 *H01L 21/02* (2006.01)

(56) References Cited

U.S. PATENT DOCUMENTS

| | | |
|---|---|---|
| 2010/0139764 A1 | 6/2010 | Smith |
| 2012/0073650 A1 | 3/2012 | Smith |
| 2013/0081694 A1* | 4/2013 | Nakayama ............ H01L 31/182 136/258 |
| 2013/0160849 A1 | 6/2013 | Yamanishi |
| 2014/0036571 A1 | 2/2014 | Kobayashi |
| 2014/0360571 A1 | 12/2014 | Ji |
| 2015/0380581 A1 | 12/2015 | Johnson |
| 2016/0072000 A1 | 3/2016 | Smith |
| 2016/0126400 A1 | 5/2016 | Ji |
| 2016/0225938 A1 | 8/2016 | Feldman |
| 2016/0284922 A1* | 9/2016 | Qiu .................. H01L 31/02167 |
| 2016/0329441 A1 | 11/2016 | Smith |

FOREIGN PATENT DOCUMENTS

| | | |
|---|---|---|
| JP | H1065205 | 3/1998 |
| JP | 2002261305 | 9/2002 |
| JP | 2012124206 | 6/2012 |
| WO | 2010142684 | 12/2010 |

OTHER PUBLICATIONS

Becker, C., et al., "Polycrystalline silicon thin films by high-rate electronbeam evaporation for photovoltaic applications—Influence of substrate texture and temperature," Energy Procedia, 2011, vol. 10, pp. 61-65.

Zielke, D., et al. "Organic-silicon heterojunction solar cells on n-type silicon wafers: The Back PEDOT concept", Solar Energy Materials and Solar Cells, 2014, vol. 131, pp. 110-116.

Zhang, X., et al., "Sputtered hydrogenated amorphous silicon for silicon heterojunction solar cell fabrication," Energy Procedia, 2014, vol. 55, pp. 865-872.

Sedani, S.H., "Fabrication and Doping of Thin Crystalline Si Films Prepared by E-Beam Evaporation on Glass Subtrate," A thesis submitted to the graduate School of Natural and Applied Sciences of Middle East Technical University, 2013, pp. 1-55.

Meiners, B-M., et al., "Sputter Damage to Amorphous Silicon Layers For Heterojunction Solar Cells," 31st European PV Solar Energy Conference and Exhibition, Sep. 18, 2015, Hamburg, Germany.

Nemeth, B., et al., "Polycrystalline silicon passivated tunneling contacts for high efficiency silicon solar cells", J. Mater. Res., Mar. 2016, vol. 31, No. 6, pp. 671-681.

* cited by examiner

SOLAR CELL FABRICATION

CROSS-REFERENCE TO RELATED APPLICATIONS

This application is the U.S. national phase filed under 35 U.S.C. § 371 claiming benefit to International Patent Application No. PCT/AU2017/000260, filed Dec. 5, 2017, which is entitled priority under 35 U.S.C. § 119 (e) to Australian Application Serial No. 2016905022, filed Dec. 6, 2016, the disclosure of which is incorporated herein by reference in its entirety.

FIELD

The invention relates to a process for fabricating silicon solar cells.

BACKGROUND

An approach to creating passivated contact regions or junctions in silicon solar cell technology is based on growing a silicon oxide layer on a silicon wafer that is thin enough (typically 1-2 nm) to permit quantum-mechanical tunneling of charge carriers (electrons and holes), and then covering it with a thicker (typically 5-200 nm) layer of doped polycrystalline silicon, the latter conferring selectivity to the transport of either electrons or holes.

Different methods to grow the silicon oxide, either thermally or chemically, to deposit the silicon layer (including PECVD of amorphous silicon, PECVD of polysilicon, and LPCVD of polysilicon) and to dope the films have been developed. So far, all methods to form the silicon layer, for the purpose of forming a passivated contact, have been based on chemical vapour deposition (CVD) that is, on the use of a chemical precursor for silicon such as silane. The chemical deposition can be assisted thermally at low pressure (LPCVD) or may be assisted by the ionization of the reactant species via the formation of a plasma (PECVD).

To achieve in situ doping of the silicon, current methods use an additional chemical, typically diborane for boron doping or phosphine for phosphorus doping. These two gases are poisonous, and silane is pyrophoric. Hence CVD processes for silicon deposition require strict safety measures and careful handling of the chemical precursors. Frequently, undoped silicon is deposited and then an extra step is used to introduce the dopant, for example by ion implantation, thermal diffusion from a gaseous source or from a doped oxide. In all cases a thermal annealing, commonly in the range of 700° C. to 1000° C., is required to activate or diffuse the dopant atoms and to re-crystallise the silicon film.

There is therefore a need for an improved method of depositing the silicon layer and the required dopants during fabrication of solar cells. The improvements may be in one or more of cost, safety, convenience, simplicity and time.

SUMMARY OF INVENTION

In a first aspect of the invention there is provided a process for fabricating a solar cell comprising depositing a layer of amorphous silicon on a substrate using physical vapour deposition and annealing the amorphous silicon so as to generate a layer of polycrystalline silicon; wherein the substrate is a thin layer of a dielectric disposed on a silicon wafer.

The following options may be used in conjunction with the first aspect, either individually or in any suitable combination.

The dielectric may be selected from the group consisting of silicon oxide, silicon nitride, titanium oxide, hafnium oxide and aluminum oxide, or mixtures of dielectrics. It may be silicon oxide or a combination of silicon oxide and silicon nitride.

The physical vapour deposition may comprise sputtering.

The process may additionally comprise the step of doping the amorphous silicon during the step of depositing. The doping may be with a dopant such that the step of annealing generates an n-type silicon layer or may be with a dopant such that the step of annealing generates a p-type polycrystalline silicon layer. The process may comprise the step of doping the amorphous silicon between the steps of depositing and annealing, with a dopant such that the step of annealing generates either an n-type or a p-type polycrystalline silicon layer. The process may comprise the step of doping the silicon during and/or after the step of annealing, with a dopant so as to generate either an n-type or a p-type polycrystalline silicon layer The dopant may be selected from the group consisting of boron, indium, gallium and aluminium, whereby the annealing generates p-type silicon. Alternatively it may be selected from the group consisting of antimony, phosphorus and arsenic, whereby the annealing generates n-type silicon.

The step of depositing may comprise sputtering. The sputtering may be conducted using a target which comprises, optionally consists of, silicon and the dopant. Alternatively the step of depositing may comprise sputtering using a target which comprises, optionally consists of, silicon with no dopant and a separate target comprising, optionally consisting of, the dopant. In a further option the sputtering may be conducted with a first target comprising, optionally consisting of, silicon with no dopant and a second target comprising, optionally consisting of silicon and the dopant. In any of these cases, the sputtering deposits a layer of amorphous silicon containing the dopant on the substrate. In this case the step of annealing may generate a layer of doped polycrystalline silicon.

The layer of dielectric may be less than about 5 nm thick.

The sputtering may be continued for sufficient time for the layer of amorphous silicon to grow to a thickness of about 5 to about 500 nm.

The annealing may be under conditions sufficient to at least partially and optionally totally convert the layer of amorphous silicon into polycrystalline silicon. The conditions may include annealing at a temperature of about 700 to about 1000° C. During the annealing, a fraction of the dopants may diffuse into the silicon wafer substrate, forming a lightly doped region there.

In one embodiment there is provided a process for fabricating a solar cell comprising depositing a layer of amorphous silicon on a substrate using sputtering, and annealing the amorphous silicon, e.g. at a temperature of about 700 to about 1000° C., so as to generate a layer of polycrystalline silicon; wherein the substrate is a layer of silicon oxide disposed on a silicon wafer and wherein the sputtering uses a target comprising silicon and a dopant, or else uses separate targets, one comprising silicon with no dopant and the other comprising the dopant, or else uses separate targets, one comprising silicon with no dopant and the other comprising silicon and the dopant whereby the step of annealing generates a layer of doped polycrystalline silicon.

In a second aspect of the invention there is provided a solar cell comprising a silicon wafer, a layer of polycrystalline silicon, and a layer of dielectric disposed between the silicon wafer and the layer of polycrystalline silicon, wherein the layer of polycrystalline silicon is produced without use of silane or any substituted silane (e.g. dichlorosilane). The layer of polycrystalline silicon may be produced without use of any chemical precursors for silicon. It may be produced without use of any chemical precursors for the dopant element.

The solar cell may be made by a process comprising depositing a layer of amorphous silicon on a substrate using physical vapour deposition and annealing the amorphous silicon so as to generate the layer of polycrystalline silicon, wherein the substrate is the layer of dielectric disposed on the silicon wafer. The step of depositing may comprise sputtering using a silicon target.

The process of the first aspect may be used to make the solar cell of the second aspect. The solar cell of the second aspect may be made by the process of the first aspect.

In a third aspect of the invention there is provided a use of physical vapour deposition of silicon for the manufacture of a solar cell.

The physical vapour deposition may be such that it deposits a layer of amorphous silicon on a dielectric layer disposed on a silicon wafer. The layer of amorphous silicon may comprise a dopant.

BRIEF DESCRIPTION OF DRAWINGS

FIG. 6: contact resistivity) of passivating contacts consisting of a tunneling SiOx and a layer of co-sputtered Si—B as a function of the thickness of the deposited film, for a re-crystallisation temperature of 900° C.

FIG. 8: contact resistivity; FIG. 9: sheet resistance) of passivating contacts consisting of a tunneling SiOx and a layer of co-sputtered Si—B as a function of the pressure in the sputtering chamber. The thickness of the deposited film is 30 nm and the re-crystallisation temperature 900° C.

FIG. 11: contact resistivity $\rho_c$; FIG. 12: sheet resistance) of passivating contacts consisting of a tunneling SiOx and a 30 nm thick polycrystalline silicon layer doped with phosphorus, as a function of the re-crystallisation temperature. In this case a single sputtering target comprising 80% silicon and 20% phosphorus was used, with a power setting of 250 W. Measurements were taken before and after performing an anneal in forming gas at 400° C.

DESCRIPTION OF EMBODIMENTS

Figure 1:
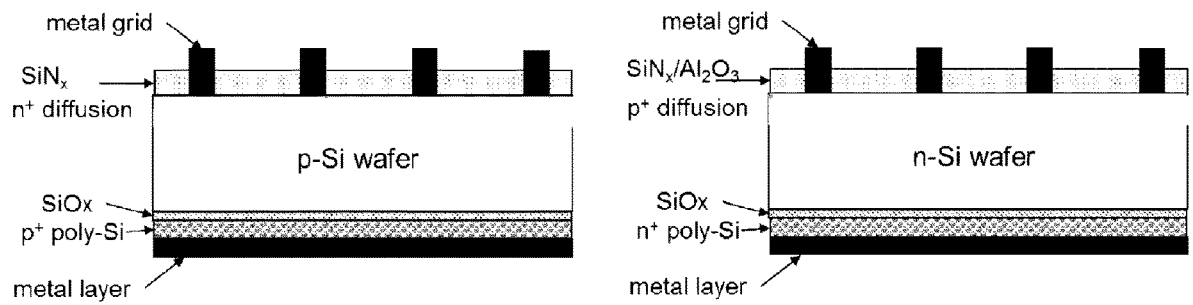
FIG. 1 is a diagrammatic representation of two possible solar cell configurations using polysilicon contacts generated by the method described herein. Left: p-type doped silicon film applied to the back of a p-type wafer solar cell. Right: n-type doped silicon film applied to the back of an n-type wafer solar cell.

The present invention relates to the use of physical vapour deposition (PVD) to the production of solar cells. In order to produce a solar cell using this process, a layer of amorphous silicon is initially deposited onto a thin dielectric layer which is itself disposed on a silicon wafer. Subsequently the amorphous silicon is annealed (also referred to herein as "crystallised" or "recrystallised") in order to convert it into polycrystalline silicon ("polysilicon" or "polySi"). As will be discussed in greater detail below, the "amorphous" silicon may not be 100% amorphous and the "polycrystalline" silicon may not be 100% polycrystalline. Rather, these terms refer to the predominant state of crystallinity in the layer.

Suitable PVD techniques which may be used in this process include cathodic arc deposition, electron beam physical vapour deposition, evaporating deposition, pulsed laser deposition, sputter deposition and sublimation sandwich methods. Due to its simplicity and widespread use, a particularly suitable technique is sputter deposition. In this technique, a plasma is formed by means of high voltage ionisation of a gas in the presence of a solid target and a substrate. The collision of ionised particles in the plasma causes ejection of particles from the target, which can then deposit on the substrate so as to coat the substrate.

The skilled person will readily be able to determine suitable conditions for sputter coating a substrate. The sputtering may be conducted at ambient temperature. It may for example be conducted at a temperature of from about 10 to about 400° C., or about 10 to 300, 10 to 200, 10 to 100, 10 to 50, 10 to 20, 20 to 400, 50 to 400, 100 to 400, 200 to 400, 20 to 100, 20 to 50, 50 to 100, 100 to 300 or 100 to 200° C., e.g. about 10, 20, 30, 40, 50, 60, 70, 80, 90, 100, 150, 200, 250, 300, 350 or 400° C., or it may be conducted at some other temperature. It may be conducted using a power of about 50 to about 500 W, or about 50 to 250, 50 to 100, 100 to 500, 250 to 500, 100 to 300 or 200 to 400 W, e.g. about 50, 100, 150, 200, 250, 300, 350, 400, 450 or 500 W. These powers, and other parameters discussed herein, are suitable for use with a target of about 7.5 cm in diameter and a substrate of about 10 cm in diameter. However for different sized targets and/or different sputtering apparatus, different powers and/or values for other parameters may be more suitable. The skilled person will readily understand suitable powers (and other parameters) for a particular target size and particular apparatus, or be able to determine suitable such parameters by routine experimentation. The sputtering may be conducted for a time of about 2 to about 20 minutes, or about 2 to 10, 2 to 5, 5 to 20, 10 to 20 or 5 to 15 minutes, e.g. about 2, 5, 10, 15 or 20 minutes. It may be conducted for sufficient time to generate the desired film thickness. It may be conducted at a pressure of about 0.5 to about 10 mTorr, or about 0.5 to 5, 0.5 to 2, 0.5 to 1, 1 to 10, 2 to 10, 5 to 10, 1 to 5 or 2 to 5mTorr, e.g. about 0.5, 1, 1.5 2, 2.5, 3, 3.5, 4, 4.5, 5, 6, 7, 8, 9 or 10 mTorr. In some instances, the pressure may be varied during the deposition process. This may enable the deposited layer to vary in properties through its depth. For example an initial relatively high pressure deposition may be followed by a relatively low pressure deposition in order to combine the benefits of high passivation (in the relatively high pressure deposited portion) and low sheet resistance (in the relatively low pressure deposited portion). In this context, relatively low pressure may be for example from about 0.5 to about 2.5 or 3 mTorr and relatively high pressure may be for example from about 3 to about 10 mTorr.

In order to obtain a doped silicon film, one option is to prepare an undoped silicon film according to the process described herein and to subsequently dope the film with the desired dopant, in order to generate either an n-type or a p-type silicon. The doping may be conducted either before or after, or optionally during, annealing by methods that are well known in the art. Suitable methods include the thermal diffusion of dopants from a solid, liquid or gaseous precursor, and the ion implantation of a suitable dose of dopants.

Alternatively, a doped silicon film may be obtained by co-sputtering silicon and a dopant. An advantage of this approach is that the doped amorphous film is obtained in a single step (rather than two separate steps) and can then be simply annealed to form the final doped polysilicon film. In one embodiment of this option, a single target is used, comprising both silicon and the dopant. The level of doping of the film may be simply controlled by controlling the ratio of silicon to dopant in the target. In another embodiment, two separate targets are used, one being a silicon target without dopant and another comprising the dopant. In this case, the level of doping may be controlled by controlling the positioning of the two targets and/or the relative surface areas of the two targets and/or the deposition parameters. In yet a further embodiment there may be more than one target of either silicon or the dopant or both. In this case the doping level may be adjusted by controlling the number, position and relative sizes of the silicon target(s) and the dopant target(s). In a further option, there may be one or more targets of silicon without dopant and one or more targets of silicon with dopant. In the event that there are different silicon and dopant targets, the power used for the silicon target(s) may the same as, or may be different to, that for the dopant target(s). This may enable the operator to vary the ratio of silicon to dopant in the deposited layer by varying the ratio of the powers for silicon and dopant. It may also enable the operator to vary the ratio of silicon to dopant over the course of the deposition. Another means to control the doping level is to vary the relative time during which power is applied to the various targets (e.g. pulsed deposition). That may produce a level of doping which is non-uniform through the thickness of the silicon layer. This may be addressed in the subsequent annealing step. Thus, for example, the silicon target may be powered throughout the sputtering process, and the dopant target switched on and off according to a desired duty cycle. Alternatively the dopant target may simply be powered on for a shorter period either in the middle or at one extreme of the silicon target power on period. During annealing, dopant may migrate within the silicon layer so as to increase the homogeneity of the dopant within the silicon layer. It should be noted that in the present specification, where a target is described as "comprising" silicon with no dopant, this indicates that the portion of the target that is vaporisable under the PVD conditions is silicon with no dopant. It will be understood that there may be other materials present in the target, for example to support the vaporisable silicon portion.

The initially formed film may be pure silicon (e.g. greater than about 99.99%) or may be doped, as discussed above. The level of doping may be from about $10^{12}$ to about $10^{21}$ atoms per cm$^2$, or from about $10^{12}$ to $10^{18}$, $10^{12}$ to $10^{15}$, $10^{15}$ to $10^{20}$, $10^{18}$ to $10^{20}$, $10^{14}$ to $10^{18}$, $10^{13}$ to $10^{15}$, or $10^{15}$ to $10^{18}$, e.g. about $10^{12}$, $10^{13}$, $10^{14}$, $10^{15}$, $10^{16}$, $10^{17}$, $10^{18}$, $10^{19}$, $10^{20}$ or $10^{21}$ atoms per cm$^2$. The initially formed film may be essentially amorphous, i.e. non-crystalline (e.g. as assessed by x-ray crystallography). It may be at least about 60% amorphous, or at least about 70, 80, 90 or 95% amorphous. It may be about 60, 65, 70, 75, 80, 85, 90, 95, 99, 99.5 or 100% amorphous. It may have no crystallinity as measured using x-ray crystallography. It may have a thickness of about 5 to about 500 nm, or about 5 to 200, 5 to 100, 5 to 50, 10 to 500, 20 to 500, 50 to 500, 100 to 500, 10 to 200, 10 to 100, 10 to 50, 20 to 100, 20 to 50 or 50 to 100 nm, e.g. about 5, 10, 15, 20, 25, 30, 35, 40, 45, 50, 60, 70, 80, 90, 100, 150, 200, 250, 300, 350, 400, 450 or 500 nm.

The substrate on which the silicon layer is formed is a dielectric layer. This should be very thin, so as to allow for tunneling of charge carriers in operation. Commonly the dielectric layer is under about 5 nm thick, or under about 4, 3, 2 or 1 nm thick. It may be for example about 1 to about 5 nm thick, or about 1 to 3, 2 to 4, 2 to 3 or 1 to 2 nm thick, e.g. about 0.5, 1, 1.5, 2, 2.5, 3, 3.5, 4, 4.5 or 5 nm thick. In some instances, however, it may be thicker than this, e.g. up to about 10, 15 or 20 nm. The dielectric layer is itself disposed on a silicon wafer. The silicon wafer may be a doped silicon wafer, e.g. a p-type silicon wafer or an n-type silicon wafer. In some embodiments the doping of the silicon wafer is the same type as the doping of the PVD deposited silicon layer (i.e. either both p-type or both n-type). This is illustrated in FIG. 1. In a particular instance of this, the dopant in the silicon wafer is the same as the dopant in the silicon layer. In other embodiments, the wafer and deposited layer have opposite dopings. In still other embodiments the wafer may be undoped, or may have a very low level of doping. Suitable dielectrics may include metal oxides, metal nitrides, semimetal oxides and semimetal nitrides, e.g. silicon oxide, silicon nitride, titanium dioxide, hafnium oxide and aluminium oxide. Mixtures of any two or more of these may also be used. It should be noted that the stoichiometry of these oxides and nitrides may vary. Therefore reference to silicon oxide does not necessarily refer to silicon dioxide or to silicon monoxide but may refer to any silicon-oxygen compound of any silicon to oxygen ratio. To reflect this, for example, silicon oxide may be represented as $SiO_x$. Commonly, but not exclusively, the ratio of silicon to oxygen or nitrogen will be within the range of about 1:1 to about 2:5. It should also be understood that reference to a "layer" of dielectric does not necessarily imply that the layer has a homogeneous composition. Therefore the layer of dielectric may for example be a homogeneous layer or may comprise two or more sublayers of different dielectrics.

Suitable dopants are well known to those skilled in the art. In particular, for generating a p-type silicon layer, suitable dopants include boron, aluminium, gallium and indium. In some instances mixtures of these may be used. In that case, one option for doping is to use a mixed element target incorporating the desired dopants. Another option is to use multiple single element targets for the different dopants. For generating an n-type silicon layer, suitable dopants include phosphorus, arsenic, antimony, bismuth and lithium. As described for p-type silicon layers, this may be achieved using a mixed element target or multiple single element targets. In some instances, both n-type and p-type dopants may be used, e.g. boron and phosphorus. In this case one of the two will predominate, so that the net result is a p-type or n-type doped silicon layer. This technique may be useful in order to simplify the fabrication some devices, particularly interdigitated back contact cells. FIG. 1 shows two possible solar cell configurations using polysilicon contacts generated by the method described herein—p-doped polysilicon on a p-type wafer and n-doped polysilicon on an n-type wafer. It will be understood that other permutations are also possible.

As discussed earlier, in order to generate the final film of optionally doped polycrystalline polysilicon, the initially formed amorphous film is annealed. This involves heating the film to a suitable annealing temperature. The heating may be at a temperature and for a time sufficient to convert the amorphous silicon to polycrystalline silicon. The conversion to polycrystalline silicon may be at least about 70%, or at least about 80, 85, 90, 95, 99, 99.5 or 99%, and may be 100%. The resulting annealed layer, referred to herein as polycrystalline, may be in fact a mixed phase which is predominantly polycrystalline but may have residual amorphous silicon. The polycrystalline silicon may therefore be at least about 70% polycrystalline, or at least about 80, 85, 90, 95, 99, 99.5 or 99%, and may be 100%. The temperature for annealing may be about 700 to about 1000° C., or about 800 to 1000, 900 to 1000, 700 to 900, 700 to 800 or 800 to 900° C., e.g. about 700, 750,800, 850, 900, 950 or 1000° C. It may be for about 30 seconds to about 60 minutes, or about 1 to 60 minutes, or about 2 to 60, 5 to 60, 10 to 60, 20 to 60, 30 to 60, 0.5 to 30, 0.5 to 10, 0.5 to 2, 0.5 to 1, 1 to 30, 1 to 10, 10 to 30, 10 to 20 or 20 to 30 minutes, e.g. about 0.5, 1, 2, 3, 4, 5, 10, 15, 20, 25, 30, 35, 40, 45, 50, 55 or 60 minutes. It may be conducted in a non-oxidising atmosphere. It may be conducted in an inert atmosphere. It may be conducted in a reducing atmosphere. The atmosphere may comprise one or more of hydrogen, nitrogen, helium, argon or neon. In one example the atmosphere comprises forming gas, i.e. a mixture of hydrogen and nitrogen or argon. As noted earlier, the initially formed amorphous silicon may not be 100% amorphous and the annealed silicon may not be 100% polycrystalline. The annealing may therefore be conducted so as to increase the polycrystallinity by at least about 50%, or at least about 60, 70, 80, 90 or 95% and in a particular case may increase it by 100%. In this context, these percentages relate to percentages of the overall film. Thus an increase from, for example, 10% polycrystallinity to 90% polycrystallinity is taken to be an increase of 80% (i.e. 90-10). The annealing may be conventional thermal annealing (CTA) or rapid thermal annealing (RTA). The latter is usually carried out for less than about 3 minutes, optionally less than 2 or 1 minute, and may require a relatively slow cooling rate following the annealing.

In some instances it may be beneficial to conduct a subsequent final anneal. This may be conducted in an inert atmosphere, or in a non-oxidising atmosphere or in a reducing atmosphere, as discussed above for the main annealing step. It may be conducted for example in a mixture of hydrogen and nitrogen. It may be conducted in forming gas. The final anneal may be conducted at a temperature below that of the earlier annealing step. It may be conducted at a temperature of between about 300 and about 600° C., or about 300 to 500, 300 to 400, 400 to 600, 500 to 600 or 400 to 500° C., e.g. about 300, 350, 400, 450, 500, 550 or 600° C. It may be conducted for about 15 to about 60 minutes, or about 15 to 30, 30 to 60 or 20 to 40 minutes, e.g. about 15, 20, 25, 30, 35, 40, 45, 50, 55 or 60 minutes. This may serve to further reduce the recombination current. In some instances, the final anneal may not be conducted.

The passivating contact produced by the present invention, comprising the dielectric layer and the polycrystalline silicon layer, commonly has excellent recombination and contact parameters. Commonly the recombination current density is below about 50 fA/cm$^2$, or below about 45, 40, 35, 30 or 25 fA/cm$^2$, and may be about 50, 45, 40, 35, 30, 25 or 20 fA/cm$^2$, or may in some cases be below 20 fA/cm$^2$. It may have a contact resistivity of less than about 0.2 $\Omega$cm$^2$, or less than about 0.1, 0.05, 0.01 or 0.005 $\Omega$cm$^2$, or between about 0.002 and 0.2, 0.005 and 0.2, 0.01 and 0.2, 0.05 and 0.2, 0.1 and 0.2, 0.002 and 0.1, 0.002 and 0.05, 0.002 and 0.01, 0.002 and 0.005, 0.01 and 0.1 or 0.005 and 0.05 $\Omega$cm$^2$, e.g. about 0.002, 0.003, 0.004, 0.005, 0.01, 0.02, 0.03, 0.04, 0.05, 0.06, 0.07, 0.08, 0.09, 0.1, 0.15 or 0.2 $\Omega$cm$^2$. It may have a sheet resistance of less than about 2000 $\Omega$/sq, or less than about 1500, 1000, 500 or 200 $\Omega$/sq, or from about 200 to about 2000 $\Omega$/sq, or about 200 to 1000, 200 to 500, 500 to 2000, 1000 to 2000 or 500 to 1000 $\Omega$/sq, e.g. about 200, 300, 400, 500, 600, 700, 800, 900, 1000, 1200, 1400, 1600, 1800 or 2000 $\Omega$/sq.

This invention relates to a method to fabricate silicon solar cells based on forming regions with asymmetric conductivity for electrons (negative charge carriers) and holes (positive charge carriers) on a silicon wafer. A high selectivity for the preferential conduction of one of the two charge carriers is achieved by the combination of thin layers of dielectric layer and doped polycrystalline silicon. An important aspect of the invention relates to the formation of the latter layer by physical vapour deposition of silicon and an appropriate dopant element, followed by thermal annealing. Physical vapour deposition by sputtering is advantageous for industrial fabrication and permits the deposition of both silicon and a dopant element that confers a desired conductivity type, for example boron (for p-type conductivity and hole-selective conduction) or arsenic (for n-type conductivity and electron-selective conduction). A post-deposition annealing treatment at an appropriate temperature renders the deposited silicon film polycrystalline and activates the dopant, resulting in high quality junctions or passivating contacts for high efficiency silicon solar cells.

Physical vapour deposition, PVD, may be used to both deposit the silicon film and a dopant element so as to produce a passivated contact. Among the various PVD techniques, sputtering offers great flexibility and control. It may be performed at room temperature and may be performed on one side of the wafer selectively, which can simplify the overall fabrication of the solar cell. As a source of silicon, the method may use a solid silicon target that is bombarded by ions, e.g. argon, in a vacuum chamber. A second solid target of a dopant species (for example boron, indium, gallium or aluminium for p-type doping and antimony, phosphorus or arsenic for n-type doping) may be used within the same machine to deposit a controlled amount of dopant. By simultaneously sputtering (co-sputtering) silicon and a dopant element, it is possible to obtain silicon films with an adequate dopant concentration. Alternatively, a single target containing a mixture of silicon and the dopant element may be used.

The as-deposited silicon film is in general amorphous. It may be transformed to a polycrystalline phase during a subsequent annealing step. At the same time such annealing activates the dopant element, incorporating it into the crystalline matrix of the silicon, resulting in a doped silicon film that has excellent characteristics as a passivating contact for solar cells. Hence, compared to prior art, an important aspect of the present invention is the use of PVD by sputtering rather than of CVD.

Compared to the common methods to form passivating contacts based on CVD of silicon films, sputtering can offer significant advantages in terms of industrial manufacturing and simplicity. Sputtering is a well-proven technology in the fields of microelectronic technology and photovoltaics, as well as being able to coat large area substrates, however it has not been previously used in fabrication of polysilicon-based passivated contacts for solar cells. Compared to in situ doping by CVD, co-sputtering avoids the use of hazardous chemicals such as diborane or phosphine, and is therefore a safer approach. Compared to subsequent doping by ion implantation, thermal dopant diffusion, or deposition of a doped oxide, co-sputtering avoids an extra process step, and the associated additional machinery and equipment. Sputtering makes it easier to incorporate the dopant in the same step as formation of the silicon film. Sputtering also permits a more flexible optimization of the contact structure. In particular, it allows lower annealing temperatures to form boron-doped films than the other existing approaches. The deposition rate is relatively fast, commonly requiring 10 minutes to obtain a 50 nm thick layer when an RF (radio-frequency) power of 250 W and a pressure of 2.7 mTorr is used in a small laboratory set-up. Higher RF powers and/or lower pressures are expected to yield even faster deposition rates.

Figure 2:
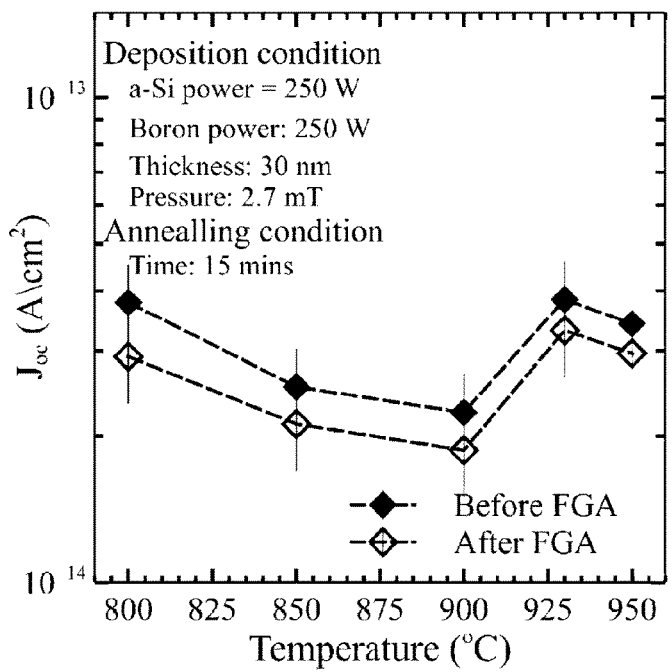
FIG. 2 shows the recombination current density $J_{0c}$ of passivating contacts consisting of a tunneling SiOx and a 30 nm thick layer of co-sputtered Si—B as a function of the re-crystallisation temperature. In this example a power setting of 250 W was used for both the silicon and the boron targets. The parameter $J_{0c}$, also called saturation current density, describes the quality of the contact structure in terms of reducing electron-hole recombination, that is, in terms of passivation.

The inventors have experimentally optimised the sputter-deposition process and the subsequent annealing for re-crystallisation and dopant activation. Co-sputtering of silicon and boron has been exemplified so as to successfully demonstrate the validity of the approach. The p-type silicon film layers were deposited onto a thin, tunneling silicon oxide layer and annealed/recrystallized at a temperature of about 870° C. This resulted in production of high quality passivating contacts with excellent properties in terms of passivation (recombination current density of 24 fA/cm$^2$). This result is comparable to results obtained for boron doped polycrystalline silicon contacts formed by PECVD (recombination current of about of 20 fA/cm$^2$). FIG. 2 shows the effect of annealing temperature on the recombination current. It will be understood that a low recombination current is indicative of a higher performance system. Suitable recombination current densities are below about 400 fA/cm$^2$, or less than about 300, 200, 100, 80, 60, 40, 30, 20 or 10 fA/cm$^2$. Using the process described herein, solar cells may be fabricated with high efficiency. For example, such solar cells may have conversion efficiencies of up to about 25%, possibly higher. They may for example have a conversion efficiency of between about 15 and about 29%, or about 15 and 25%, or 15 to 20%, 20 to 25%, 20 to 23% or 21 to 24%, e.g. about 15, 16, 17, 18, 19, 20, 21, 22, 23, 24, 25, 26, 27, 28 or 29%.

An alternative approach envisaged by the inventors is to deposit undoped silicon onto the substrate and subsequently dope it using conventional thermal dopant diffusion technology. This dopant diffusion may be conducted before, during or after the recrystallisation annealing.

Among the possible applications of these deposited junctions formed by sputtering and crystallization of silicon films are:

As a p+ back surface region implemented on the prevalent type of silicon solar cells, which use a p-type wafer and a front n+ region formed by phosphorus diffusion. The passivating contact formed by the presently described method would replace current p+ regions formed by alloying aluminium, providing a much better suppression of recombination losses. It would also compete favourably with the earlier technology, where dielectric layers of $Al_2O_3$ and SiN are deposited on the rear surface, subsequently ablated locally with a laser and finally metallised with an Al paste. The passivating contact of the present invention would provide improved solar cell performance and process simplification.

As described above, but using n-type wafers, in which the p+ doped polysilicon would form the main junction of the device, in this case located at the rear. Currently such cells are being made by diffusing boron into the n-type wafer.

A p+ passivated contact according to the present invention can be implemented into an IBC cell process (Interdigitated back junction solar cell). The p+ polycrystalline silicon layer could be deposited selectively (e.g. using a stencil mask to deposit the p-doped silicon film) or etched selectively in an appropriate pattern, possibly before the re-crystallisation step. Subsequently, an n+ passivated contact according to the present invention can be formed on the areas where the bulk of the silicon wafer is now exposed. Alternatively, those exposed areas could be subjected to a phosphorus diffusion step, thus creating an interdigitated structure of p+ and n+ regions on the back side of the wafer.

An n+ passivated contact according to the present invention could be used in complementary ways to those mentioned above.

p+ and n+ layers produced according to the present invention can be formed on opposite sides of a silicon wafer to create p+nn+ or n+pp+ solar cell structures.

FIG. 1 illustrates two suitable solar cell configurations which may be conveniently made by the process of the present invention. In the left hand option, both the polysilicon and the silicon wafer are p-type, e.g. doped with boron, and in the right hand option both are n-type, e.g. doped with phosphorus. In each case, the silicon wafer has opposite doping (i.e. p-type on the n-doped silicon wafer and n-type on the p-doped silicon wafer) on the face opposite the polysilicon layer. On the opposite doping layer, is a final layer of silicon nitride for antireflection and surface passivation purposes. On boron diffusions an additional thin layer of aluminium oxide or dielectric is usually employed for better surface passivation.

The process of the present invention would open the market of polysilicon contacts to sputtering machine manufacturers. It is expected to be straightforward to transfer it to large area sputtering PVD machines.

In general, methods to fabricate silicon solar cells include the formation of regions with asymmetric conductivity for electrons (negative charge carriers) and holes (positive charge carriers) on a silicon wafer. In the method of the present application, a high selectivity for the preferential conduction of one of the two charge carriers is achieved by the combination of thin layers of dielectric and doped polycrystalline silicon. Important aspects of this work are the formation of the latter layer by physical vapour deposition of silicon and an appropriate dopant element, followed by thermal annealing. Physical vapour deposition by sputtering is advantageous for industrial fabrication and permits deposition of both silicon and a dopant element that confers to it the desired conductivity type, for example boron, indium, gallium or aluminium (for p-type conductivity and hole-selective conduction) or arsenic, phosphorus or antimony (for n-type conductivity and electron-selective conduction). A post-deposition annealing treatment at an appropriate temperature makes the deposited silicon film polycrystalline and activates the dopant, resulting in high quality junctions, or passivated contacts for silicon solar cells.

EXAMPLES

The present experiments have focused on co-sputtering of silicon and boron. Two important parameters have been measured that characterize the quality of the passivated contacts: recombination current density $J_o$ (otherwise known as "saturation current density"), which defines the ability to passivate, and contact resistivity $\rho_c$, which defines the ability to transport current. The inventors have measured excellent properties in terms of passivation (recombination current density of about 20 fA/cm$^2$) and current transport (contact resistivity of about 20 m$\Omega$cm$^2$). These results are comparable to those obtained previously for boron doped polycrystalline silicon contacts formed by CVD. Therefore, they demonstrate that the presently described novel approach based on PVD (sputtering) is capable of providing equivalent performance to the conventional approach based on CVD, and that it allows fabrication of high efficiency solar cells without the disadvantages of CVD.

The initial experimental work explored the sputter-deposition process and the subsequent annealing for re-crystallisation and dopant activation and diffusion, as well as an initial study of the impact of the thickness of the deposited silicon layer and the pressure in the sputtering chamber during deposition. These experiments provide examples of the optimization that may be conducted for the purpose of passivated contacts for silicon solar cells.

FIG. 2 shows the recombination current density $J_{0c}$ of passivated contacts consisting of a tunneling SiO$_x$ (approximately 1.5 nm thick) and a 30 nm thick layer of co-sputtered Si—B as a function of the annealing temperature. It can be seen that the recombination current density $J_{0c}$ is lower than 40 fA/cm$^2$ for a wide range of annealing temperatures between 800° C. and 950° C. An additional anneal at a low temperature of 400° C. in forming gas (5% hydrogen in nitrogen or argon) reduces the recombination current further, bringing it below 20 fA/cm$^2$ at a recrystallization temperature of 900° C. This final anneal (FGA) is, however, not essential in this particular case, since the values of $J_{0c}$ are already quite low even without it.

Figure 3:
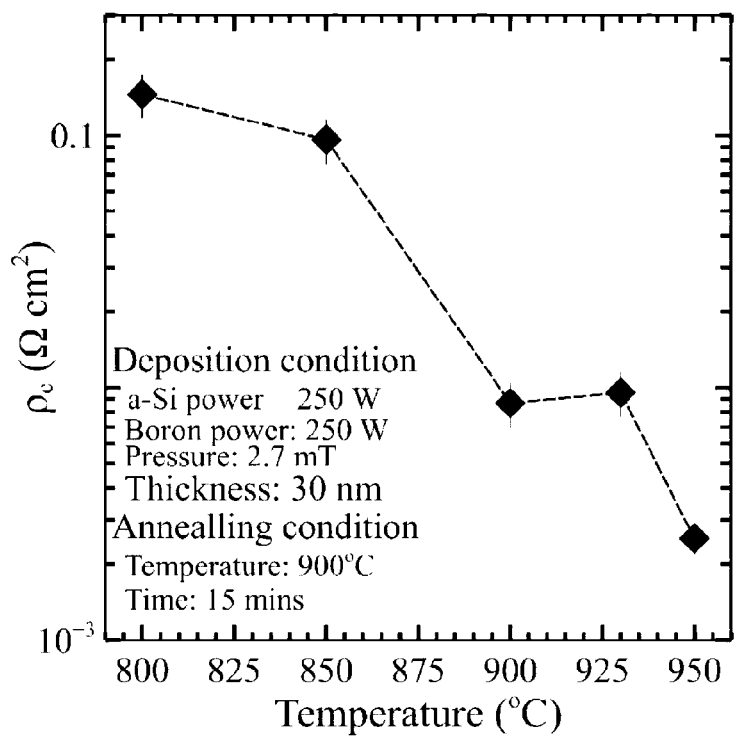
FIG. 3 shows contact resistivity $\rho_c$ of passivating contacts consisting of a tunneling SiOx and a 30 nm thick layer of co-sputtered Si—B as a function of the re-crystallisation temperature.

FIG. 3 shows that the corresponding contact resistivity remains below 200 m$\Omega$cm$^2$ over the same temperature range, which is adequate for a full area solar cell contact. Nevertheless, it is possible to achieve a contact resistivity lower than 10 m$\Omega$cm$^2$ by using a relatively high annealing temperature, above 900° C.

For the conditions in this experiment (layer thickness of 30 nm, Si and B co-sputtered at a power of 250 W and a pressure of 2.7 mTorr, annealing time of 15 min), the optimal annealing temperature is approximately 900° C. At this temperature the contact parameters are $J_{0c} \approx 20$ fA/cm$^2$, and $\rho_c \approx 10$ m$\Omega$cm$^2$, which are adequate to make high efficiency solar cells. Although in general the optimum temperature for re-crystallisation may vary with the thickness and deposition conditions of the silicon layer, it is notable that in these experiments the re-crystallisation temperature is not critical, and that a good passivation and a satisfactory contact resistivity are achieved over a broad range of temperatures.

Figure 4:
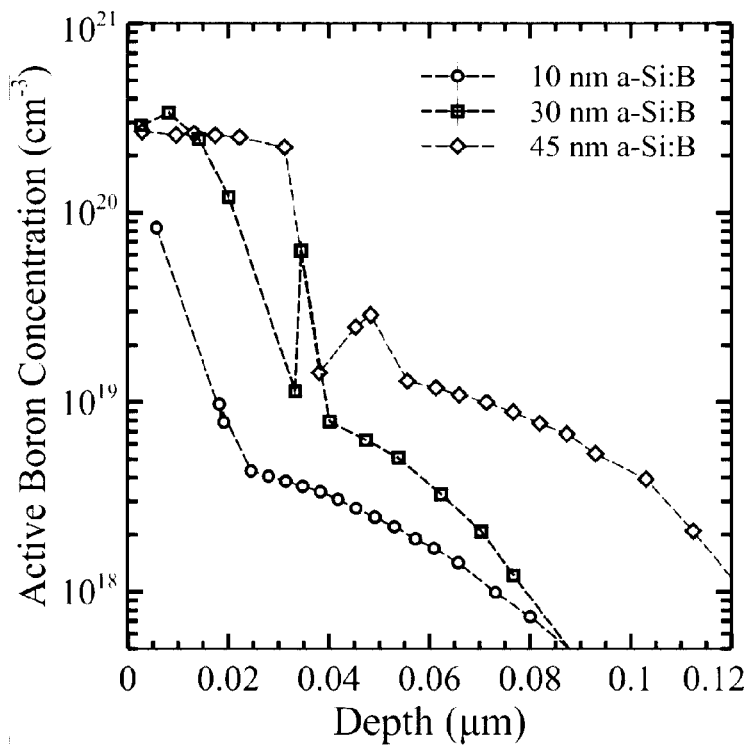
FIG. 4 shows active boron concentration as a function of depth of passivated contact structures consisting of a tunneling $SiO_x$ and a film of co-sputtered Si—B, re-crystallised at 900° C., for three deposited films with an approximate thickness of 10 nm, 30 nm and 45 nm.

Additional experiments were performed to investigate the impact of the silicon film thickness on the contact parameters. The sputtering deposition conditions were maintained (power of 250 W for both the silicon and boron targets, pressure of 2.7 mTorr, substrate at room temperature) and a temperature of 900° C. during 15 min was chosen for the re-crystallisation/dopant activation annealing in nitrogen. FIG. 4 shows the active boron concentration as a function of depth for three passivated contact structures where the thickness of the deposited Si—B film was 10 nm, 30 nm and 45 nm, approximately. These boron concentration profiles were measured by the ECV technique (Electrochemical Capacitance-Voltage), which reveals the presence of and permits to measure the concentration of electrically active boron atoms in the polycrystalline silicon film (boron concentration up to about $4 \times 10^{20}$ cm$^{-3}$), and into the crystalline silicon wafer (boron concentration up to about $2 \times 10^{19}$ cm$^{-3}$, in these experimental conditions).

Figure 5:
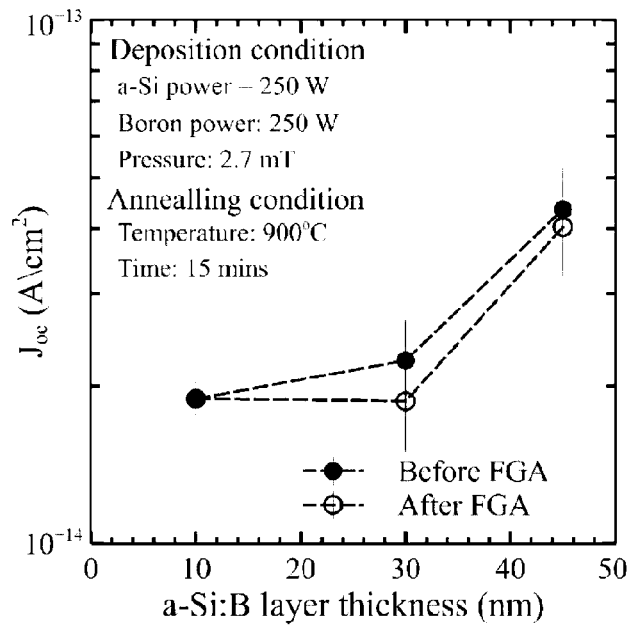
FIGS. 5 to 6 show recombination and contact parameters (FIG. 5: recombination current density.
Figure 6:
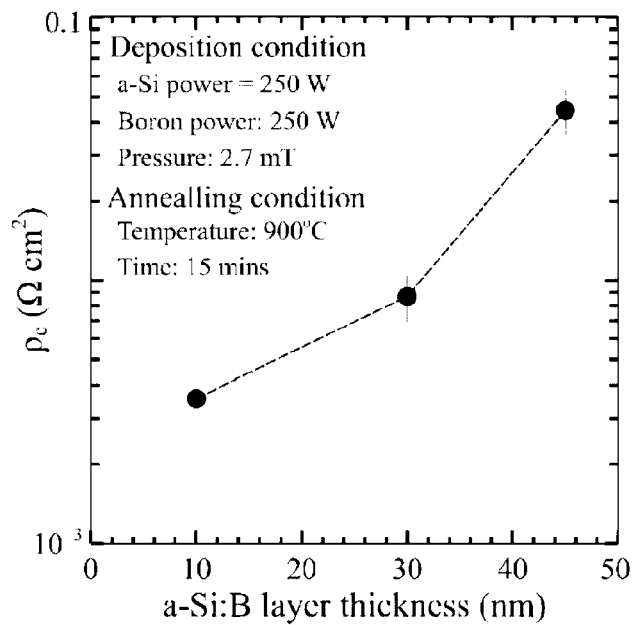

FIGS. 5 and 6 show the recombination current density $J_{0c}$ and the contact resistivity $\rho_c$ parameters corresponding to the three cases shown in FIG. 4. It can be observed that both $J_{0c}$ and $\rho_c$ increase with the thickness of the silicon film. Despite such increase, even the thickest 45 nm Si—B film in this experiment can provide quite good recombination and contact parameters, $J_{0c} \approx 40$ fA/cm$^2$ and $\rho_c 45$ m$\Omega$cm$^2$. Thicker Si—B films are possible and may be desirable in some circumstances. The optimization of the annealing conditions should be tailored to each thickness of the silicon film, and such further optimization may result in improved recombination and contact parameters.

Figure 7:
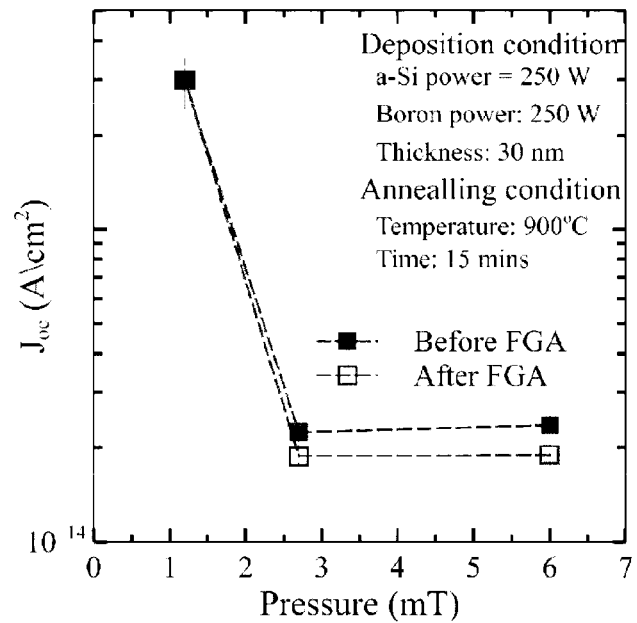
FIGS. 7 to 9 show recombination and contact parameters (FIG. 7: recombination current density.
Figure 8:
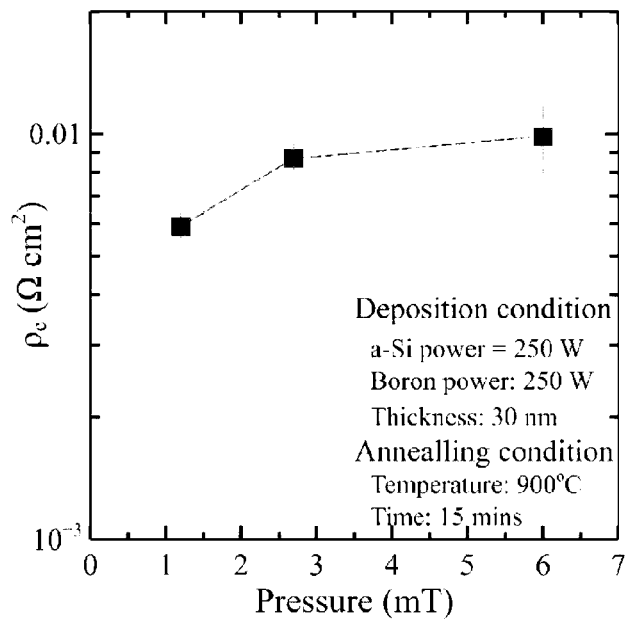
Figure 9:
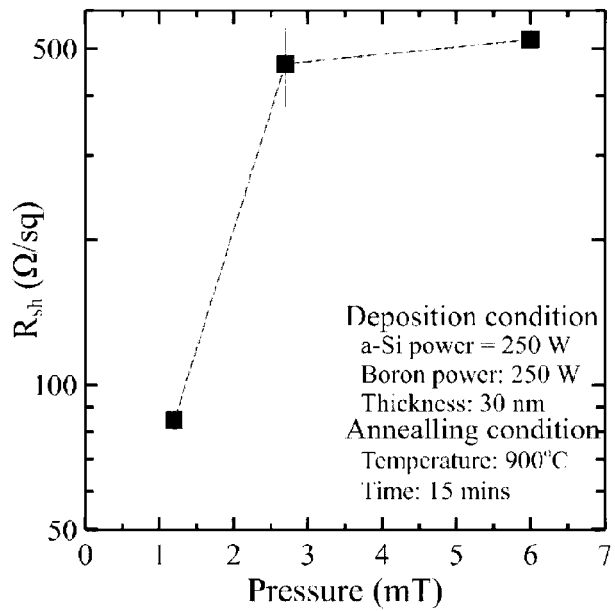
Figure 10:
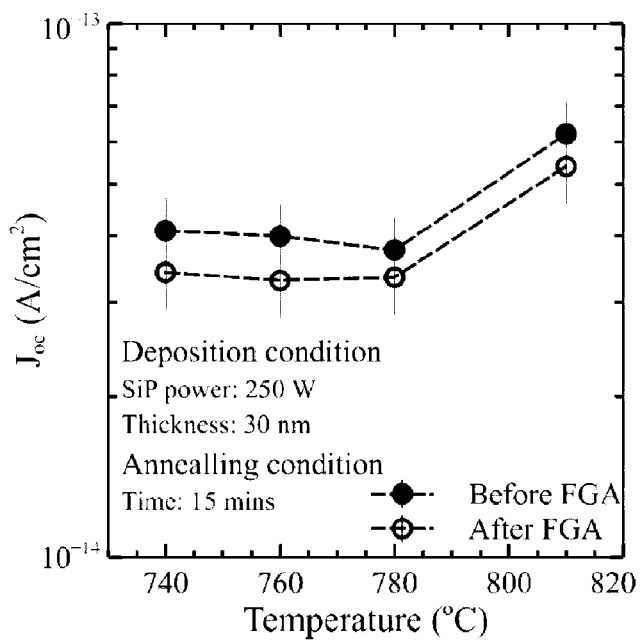
FIGS. 10 to 12 show the recombination and contact parameters (FIG. 10: recombination current density $J_{0c}$.
Figure 11:
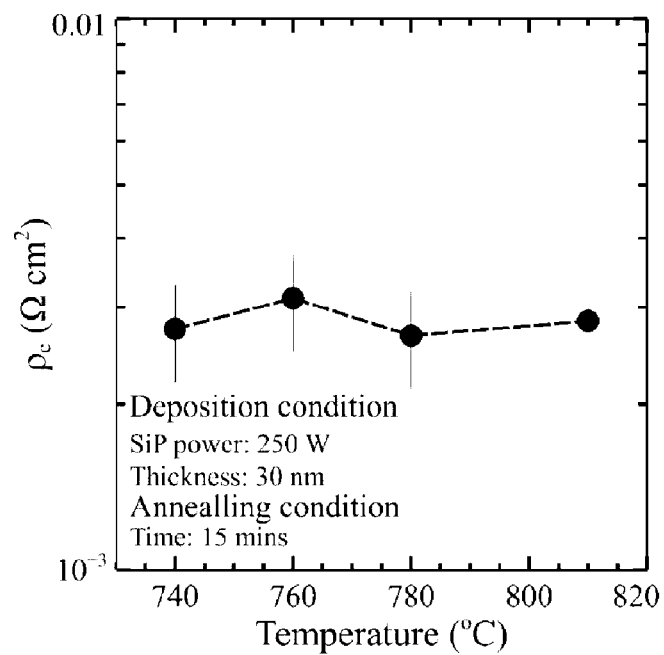
Figure 12:
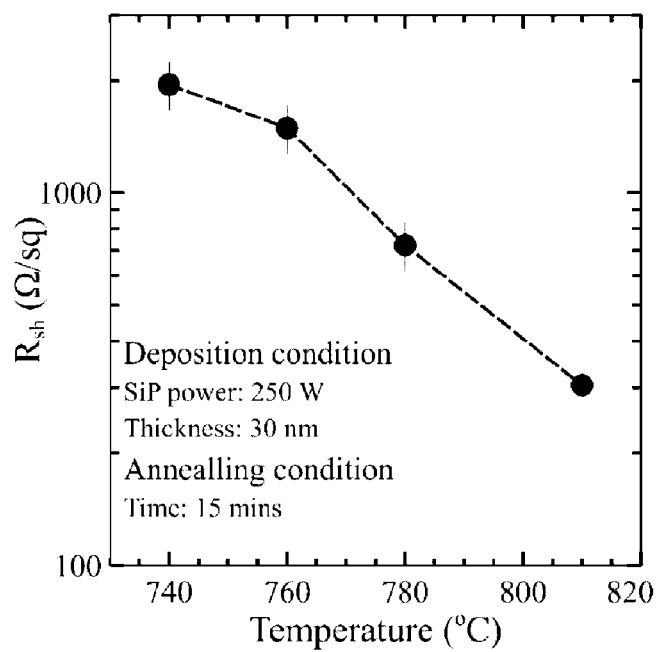

Another deposition parameter that can have a significant influence on the contact parameters is the pressure. This is closely related to the amount or argon introduced in the chamber to perform the sputtering of the target species. FIGS. 7 and 8 indicate that, for the laboratory-size sputtering machine used in these experiments, the pressure should preferably be higher than 2.7 mTorr to achieve a low recombination current, while maintaining a reasonable contact resistance. FIG. 9 shows the sheet resistance $R_{sh}$ of the same passivated contact structure as a function of the pressure. This $R_{sh}$ parameter reflects the concentration of active boron atoms present in the polycrystalline silicon layer and in the near-surface part of the silicon wafer, as well as the mobility of the holes (positive charge carriers) associated with those electrically active boron atoms. A lower pressure of about 1 mTorr results in lower sheet resistance of $R_{sh} \approx 85$ $\Omega$/sq, but with a much higher recombination current, as shown in FIG. 7. It is expected that two sequential Si—B layers could be combined in applications where a low $R_{sh}$ is desirable for the lateral transport of current: a first layer deposited at a relatively high pressure to achieve good passivation (low recombination parameter $J_{0c}$) and a subsequent layer deposited at low pressure to achieve a low sheet resistance. Both could be sequentially deposited in a single sputtering process (that is, without taking the samples out of the machine), hence without significantly increasing process complexity. Thus the "layer" of optionally doped silicon may be homogeneous in composition, or may vary gradually through its depth, or may comprise two or more sub-layers of different composition.

FIGS. 10 to 12 and 14 provide similar data to earlier figures for phosphorus doped silicon (rather than boron doped silicon in the earlier figures). This illustrates that comparable results may be obtained with an n-type dopant and a p-type dopant.

Figure 15:
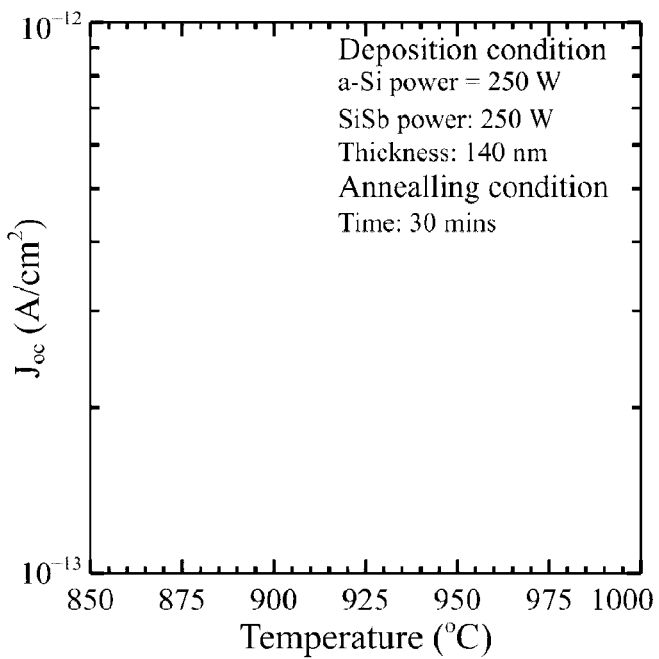
FIG. 15 shows the recombination current density $J_{0c}$ of passivating contacts consisting of a tunneling SiOx and a 140 nm thick polycrystalline silicon layer doped with antimony, as a function of the re-crystallisation temperature. In this case two separate sputtering targets were used, one of pure silicon and another one containing 30% antimony and 70% silicon, with a power setting of 250 W for both.

FIG. 15 shows the recombination current density $J_{Oc}$ of passivating contacts for an antimony-doped silicon as a function of the re-crystallisation temperature, demonstrating a further n-type dopant.

Figure 13:
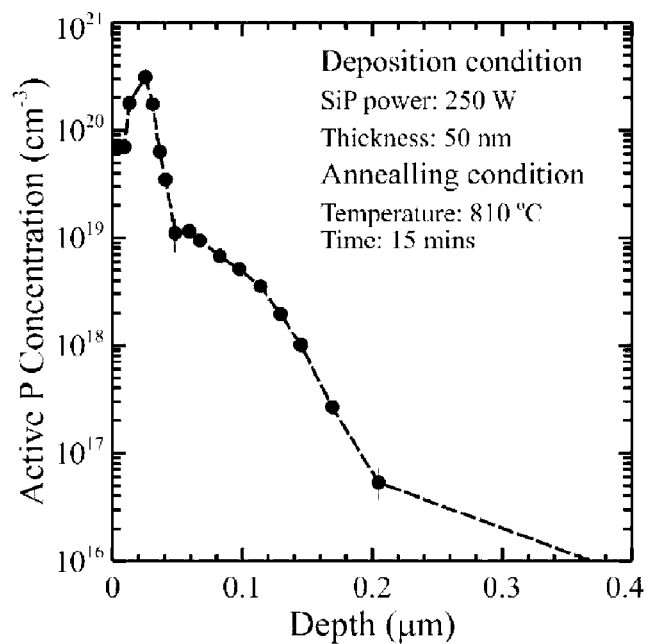
FIG. 13 is a graph showing electrically active (ionised) dopant concentration as a function of depth for a 50 nm thick polySi layer annealed at 810° C. for 15 minutes.
Figure 14:
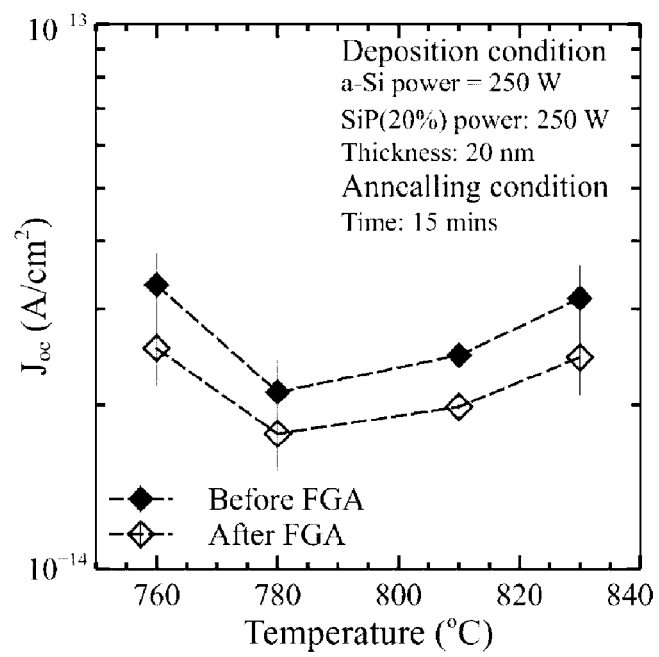
FIG. 14 shows the recombination current density $J_{0c}$ of passivating contacts consisting of a tunneling SiOx and a 20 nm thick polycrystalline silicon layer doped with phosphorus, as a function of the re-crystallisation temperature. In this case two separate sputtering targets were used, one of pure silicon and another one containing 20% phosphorus and 80% silicon, with a power setting of 250 W for both. Measurements were taken before and after performing an anneal in forming gas at 400° C.
Figure 16:
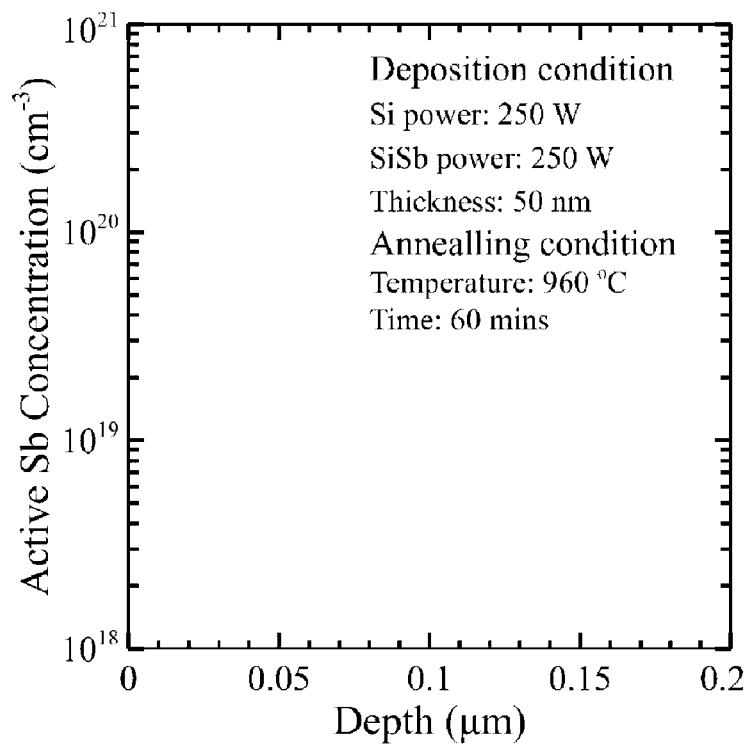
FIG. 16 is a graph showing electrically active (ionised) antimony concentration as a function of depth for a 50 nm thick polySi layer annealed at 960° C. for 60 minutes.

FIGS. 13 and 16 show electrically active (ionised) phosphorus and antimony concentration as a function of depth for annealed polysilicon layers respectively.

The invention claimed is:

1. A process for fabricating a solar cell comprising:
depositing a layer of amorphous silicon on a substrate using physical vapour deposition;
annealing the amorphous silicon to generate a layer of polycrystalline silicon; and
after annealing, conducting another anneal at a temperature of between 300° C. and 600° C.,
wherein the substrate is a layer of a dielectric disposed on a silicon wafer, said layer of dielectric being less than 5 nm thick.

2. The process of claim 1 wherein the physical vapour deposition comprises sputtering.

3. The process of claim 1 wherein the dielectric is selected from the group consisting of silicon oxide, silicon nitride, titanium oxide, hafnium oxide, aluminium oxide, and a combination of any two or more of these.

4. The process of claim 3 wherein the dielectric is silicon oxide or a combination of silicon oxide and silicon nitride.

5. The process of claim 1 additionally comprising the step of doping the amorphous silicon during the step of depositing, with a dopant such that the step of annealing generates either an n-type or a p-type polycrystalline silicon layer.

6. The process of claim 5 wherein the dopant is selected from the group consisting of boron, indium, gallium and aluminium, whereby the annealing generates p-type silicon.

7. The process of claim 5 wherein the dopant is selected from the group consisting of antimony, phosphorus and arsenic, whereby the annealing generates n-type silicon.

8. The process of claim 5 wherein the step of depositing comprises sputtering using a target which comprises silicon and the dopant, whereby the sputtering deposits a layer of amorphous silicon containing the dopant on the substrate and whereby the step of annealing generates a layer of doped polycrystalline silicon.

9. The process of claim 5 wherein the step of depositing comprises sputtering using a target which comprises silicon with no dopant and a separate target comprising the dopant and optionally also silicon, whereby the sputtering deposits a layer of amorphous silicon containing the dopant on the substrate and whereby the step of annealing generates a layer of doped polycrystalline silicon.

10. The process of claim 1 additionally comprising the step of doping the amorphous silicon between the steps of depositing and annealing, with a dopant such that the step of annealing generates either an n-type or a p-type polycrystalline silicon layer.

11. The process of claim 1 additionally comprising the step of doping the amorphous silicon during and/or after the step of annealing, with a dopant, to generate either an n-type or a p-type polycrystalline silicon layer.

12. The process of claim 1 wherein the depositing is continued for sufficient time for the layer of amorphous silicon to grow to a thickness of about 5 to about 500 nm.

13. The process of claim 12 wherein the annealing is performed at a temperature of about 700 to about 1000° C.

14. The process of claim 1 wherein the annealing is under conditions sufficient to convert the layer of amorphous silicon into polycrystalline silicon.

* * * * *